United States Patent
Mangtani

(12) 
(10) Patent No.: US 6,424,026 B1
(45) Date of Patent: Jul. 23, 2002

(54) POWER MODULE WITH CLOSELY SPACED PRINTED CIRCUIT BOARD AND SUBSTRATE

(75) Inventor: Vijay Mangtani, Playa del Rey, CA (US)

(73) Assignee: International Rectifier Corporation, El Segundo, CA (US)

( * ) Notice: Subject to any disclaimer, the term of this patent is extended or adjusted under 35 U.S.C. 154(b) by 0 days.

(21) Appl. No.: 09/630,694

(22) Filed: Aug. 2, 2000

Related U.S. Application Data

(60) Provisional application No. 60/146,663, filed on Aug. 2, 1999, now abandoned, and provisional application No. 60/146,687, filed on Aug. 2, 1999.

(51) Int. Cl.[7] ............................................. H01L 23/495
(52) U.S. Cl. ...................................... 257/675; 257/706
(58) Field of Search ............................... 257/675, 706, 257/707, 720; 361/719

(56) References Cited

U.S. PATENT DOCUMENTS 5,583,377 A  * 12/1996  Higgins ........................ 257/707

FOREIGN PATENT DOCUMENTS

JP         07263621 A   * 10/1995

* cited by examiner

*Primary Examiner*—Nathan Flynn
*Assistant Examiner*—Leonardo Andujar
(74) *Attorney, Agent, or Firm*—Ostrolenk, Faber, Gerb & Soffen, LL

(57) ABSTRACT

A power module has a printed circuit control component board disposed atop an IMS with an opening in the printed circuit board exposing the top surface of the IMS and power semiconductor die mounted thereon. The top surface of the IMS is closely spaced to the top surface of the printed circuit board so that wire bonds have a reduced drop from the printed circuit board to the IMS. The IMS may be cemented to the periphery of the opening in the printed circuit board, or may be located toward the top of an opening in an insulation support shell which receives a mesa from a support heat sink, which permits the close spacing of printed circuit board and IMS.

4 Claims, 4 Drawing Sheets

US 6,424,026 B1

POWER MODULE WITH CLOSELY SPACED PRINTED CIRCUIT BOARD AND SUBSTRATE

RELATED APPLICATIONS

This application is based on and claims priority to U.S. Provisional Patent Application No. 60/146,663, filed Aug. 2, 1999; and U.S. Provisional Patent Application No. 60/146,687, filed Aug. 2, 1999, the entire disclosure of each is hereby incorporated by reference.

This application is related to application Ser. No. 09/197,078 filed Nov. 20, 1998 now abandoned, entitled ADAPTABLE PLANAR MODULE (IR-1520); the disclosure of which is incorporated herein by reference.

FIELD OF THE INVENTION

This invention relates to semiconductor device power modules and more specifically relates to a novel structure for such devices which reduces their manufacturing cost and increases their reliability.

BACKGROUND OF THE INVENTION

Semiconductor modules are well known, in which a plurality of power semiconductor die are fixed to a substrate support of an insulation metal substrate (IMS) or the like to interconnect the devices. Dual bonded copper (DBC) substrates can be used in place of IMS. The substrate support is carried in a main support shell which also supports a printed circuit board (PCB) which carries control circuits for controlling the power die. Power terminals extend from the IMS for connection to a load, such as a motor and a PCB carries a terminal connector for connection to an external source of control signals. Such devices, as shown in aforementioned application Ser. No. 09/197,078 are usually arranged so that the IMS is secured within a small opening in the shell (so that the area of the expensive IMS can be minimized) and the bottom surface of the IMS can be pressed into contact with the top flat surface of a heat sink.

The PCB is generally supported in a plane above the plane of the IMS and is laterally removed from the IMS area. The bottom of the PCB is thus spaced above the top surface of the support shell so that components can be mounted on the bottom surface of the PCB as well as on its top surface.

As a result of this structure, wire bonds to the control electrodes of the power die on the IMS, for example, gate electrodes and temperature and current sense and Kelvin electrodes of MOSFETs and IGBTs, must extend from the lower plane of the top surfaces of the power die to the upper plane of the upper surface of the PCB, creating long wire bonds which are difficult to manage.

Further, in the prior art structure, a substrate, usually IMS, containing the interconnected power semiconductor die, shunts, temperature and current sensors is first attached to an insulation base shell. A PCB is next attached to the base shell and wire bonds are made between the silicon die and substrate to the PCB. A cap is next placed over the IMS and encapsulant, for example, a silicone is introduced into the interior of the cap and atop the IMS through openings in the cap, and the silicone is cured. It would be advantageous to reduce the part count for the module.

BRIEF DESCRIPTION OF THE INVENTION

In accordance with a first feature of the present invention, the support insulation shell structure is modified to support the IMS in a higher plane above the bottom of the shell and closer to the plane of the PCB. The main heat sink to receive the module is also modified to have a raised flat topped mesa to engage the raised bottom surface of the IMS. Thus, the difference in height between the IMS (or other similar substrate) and the PCB is reduced and they are in closely adjacent parallel planes. By "closely adjacent" is meant less than about twice the thickness of the IMS.

This novel structure produces a number of advantages. First, the reduction in the height differential of the tops of the die on the IMS and the top of the PCB improves wire bondability and the quality of the wire bonds, thus improving production yield.

Second, the length of wire bonds is reduced, and mechanical stress on the wirebonds during device operation is reduced.

Third, the volume of the cavity that needs to be filled by encapulant above the IMS is reduced, reducing the volume of potting material used.

In accordance with a second feature of the present invention, the substrate carrying the power die and current and temperature sensors, shunts and the like is attached directly to and supports the PCB and the conventional insulation base shell is eliminated. The PCB has suitable openings to expose the top of the IMS substrate, leaving accessible wire bonding locations for bonding between the silicon substrate and the PCB. A cap is next mounted on top of the assembly and is secured by adhesive or by a screw structure. The cap is pressed toward the surface of the heat sink. All module electrical tests can be performed prior to heat sink mounting and encapsulation.

If the control circuit is elaborate and control components are desirable on the bottom surface of the heat sink, the heat sink can be undercut in these areas to provide the necessary space.

It will be noted that the substrate in the present invention is not glued to a shell and pressed into contact with the heat sink, but is adhesively attached directly to the heat sink for improved thermal characteristics.

DETAILED DESCRIPTION OF THE INVENTION

Figure 1:
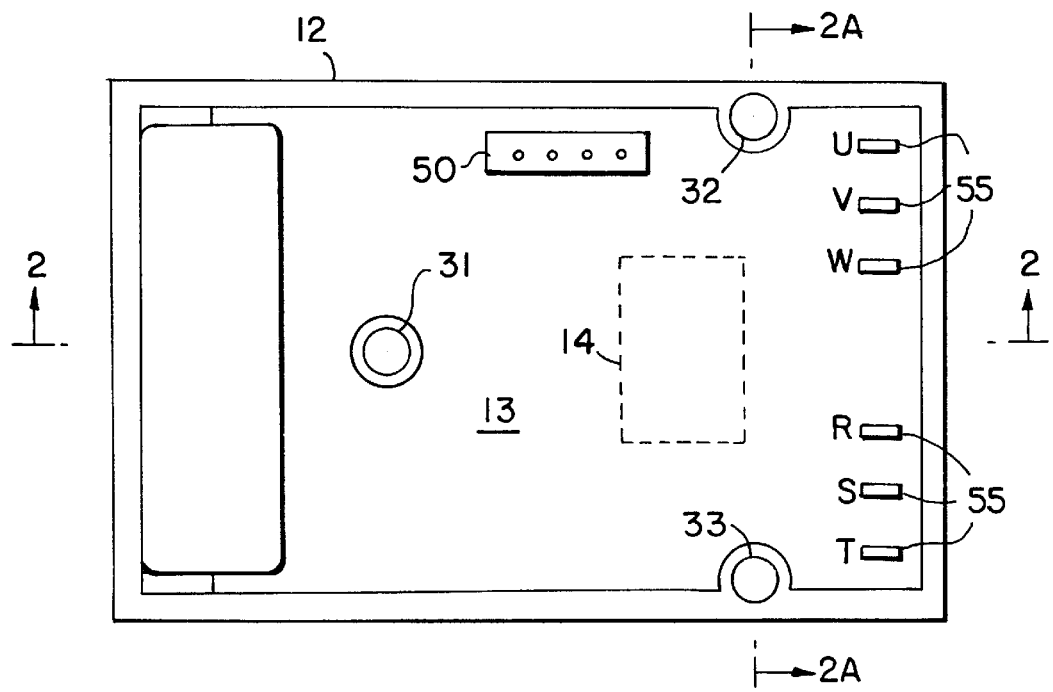
FIG. 1 is a top view of an assembled power module of the prior art.
Figure 2:
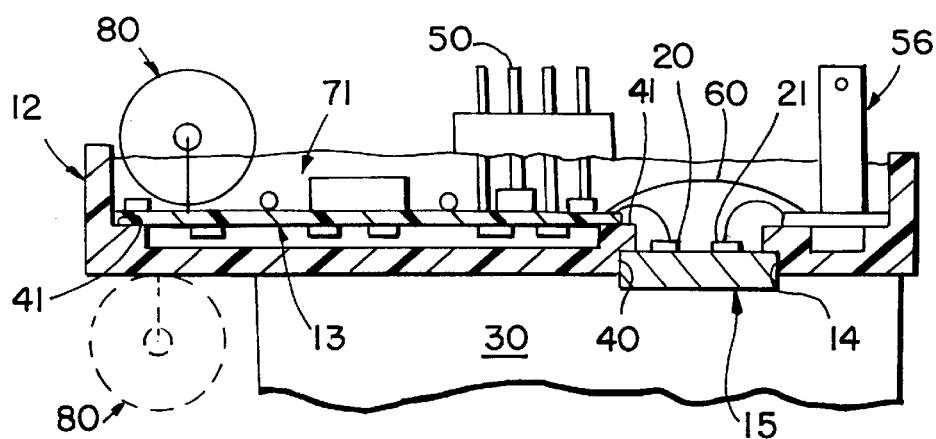
FIG. 2 is a cross sectional view of FIG. 1 taken across section line 2—2 in FIG. 1.

Referring first to FIGS. 1 and 2 there is shown a typical prior art module, such as that of application Ser. No. 09/197,078, previously referred to, and the subject matter of which is incorporated by reference. Thus, a molded shell support base 12 supports a PCB 13 and has a bottom opening 14 in which an IMS 15 (FIG. 2) is mounted. The IMS could be DBC or the like. The IMS 15 is a flat sheet of material in which upper and lower conductive layers are insulated by a central insulation film. The conductive layers can include a lower relatively thick copper or aluminum heat sink and a relatively thin upper copper layer which can be patterned to form conductive mounting pads to which power die, such as die 20 and 21 can be mounted and interconnected. The die attach can be obtained by solder reflow or conductive epoxy or the like.

Figure 2A:
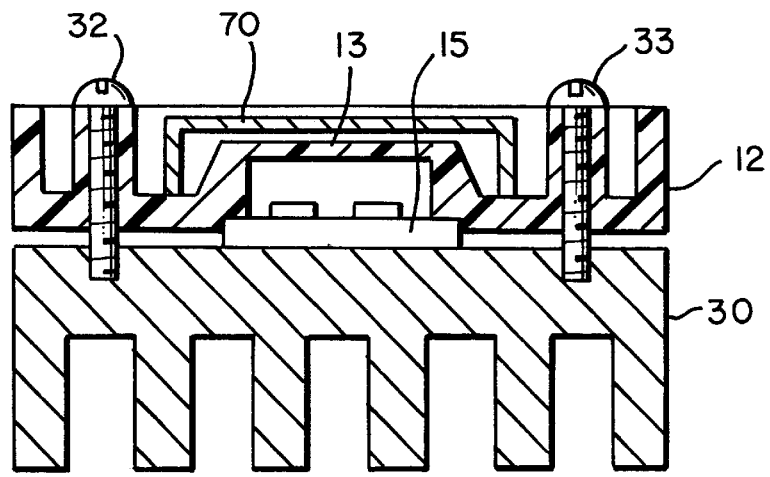
FIG. 2A is a cross section of FIG. 1 taken across section line 2A—2A in FIG. 1.

The bottom surface of IMS 15 is pressed into contact with the flat upper surface of heat sink 30 (FIG. 2) as by insulated bolts 31, 32, 33 in shell 12 (FIGS. 1 and 2A). Note that the IMS 15 is fitted into a shouldered groove 40 in opening 14 (FIG. 2). Further, printed circuit board 13 sits atop a shelf 41 in shell 12 so that space is provided for components on the bottom of shelf 41.

Wire bonds are then made from die 20 and 21 to terminals on the printed circuit board 13 which will carry processed control signals from control terminal block 50 to contact the operation of the power die 20 and 21. The outputs of the power die are connected, as by wire bonds, to suitable power output terminals 55–56.

Figure 3:
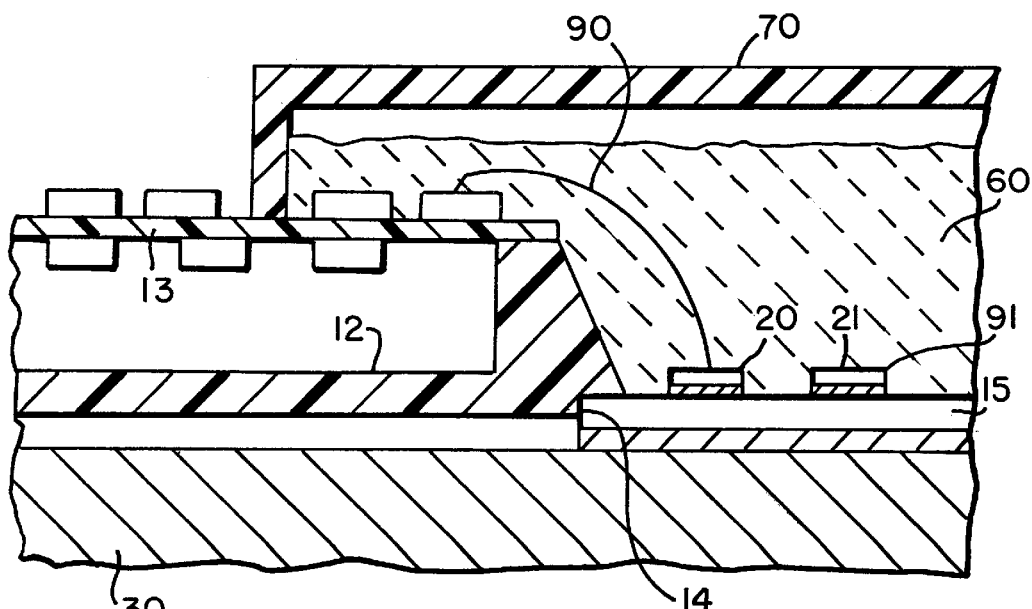
FIG. 3 is an enlargement of a portion of FIG. 2 with the top cap in place.

A potting compound, for example a suitable flexible silastic 60 fills the cavity above the IMS 15, and is covered by cap 70 as shown in FIG. 3. Note that cap 70 may be first secured in place and the silastic or other potting material can be poured through openings in the cap and cured. A lower grade potting material can be used to fill the entire interior of shell 13.

Filter capacitors such as capacitor 80 can also be included with the module.

The structure shown in FIGS. 1 and 2 may typically have overall dimensions of 3.0"×2.0"×0.5" and can house a full motor control circuit, including an inverter, input circuits, protective circuits, and a microprocessor. The inverter and other power die are fastened to the IMS 15, while other components are on the PCB 13.

FIG. 3 shows an enlarged portion of the structure of FIG. 2, with a cap 70 in place to enclose silastic 60. It will be understood that the wirebond surfaces of IMS 15 and PCB 13 are in planes of different heights. As a consequence, a large volume of encapsulant is necessary to cover the IMS 15 surface and the wires 90 and 91 (FIG. 3), which are to be wirebonded from IMS 15 to PCB 13 or the terminal pad of terminals 55 and 56 (FIGS. 1 and 2). Further, the wirebonds are long and relatively difficult to manage.

It is possible, in FIG. 2, to substantially lower the plane of PCB 13. However, this makes it impossible to place components on the underside of PCB 13, thus requiring a larger area for the PCB 13. Further, the PCB 13 is then brought closer to the heat sink 30 in FIG. 2, making the PCB 13 run at a higher temperature.

Figure 4:
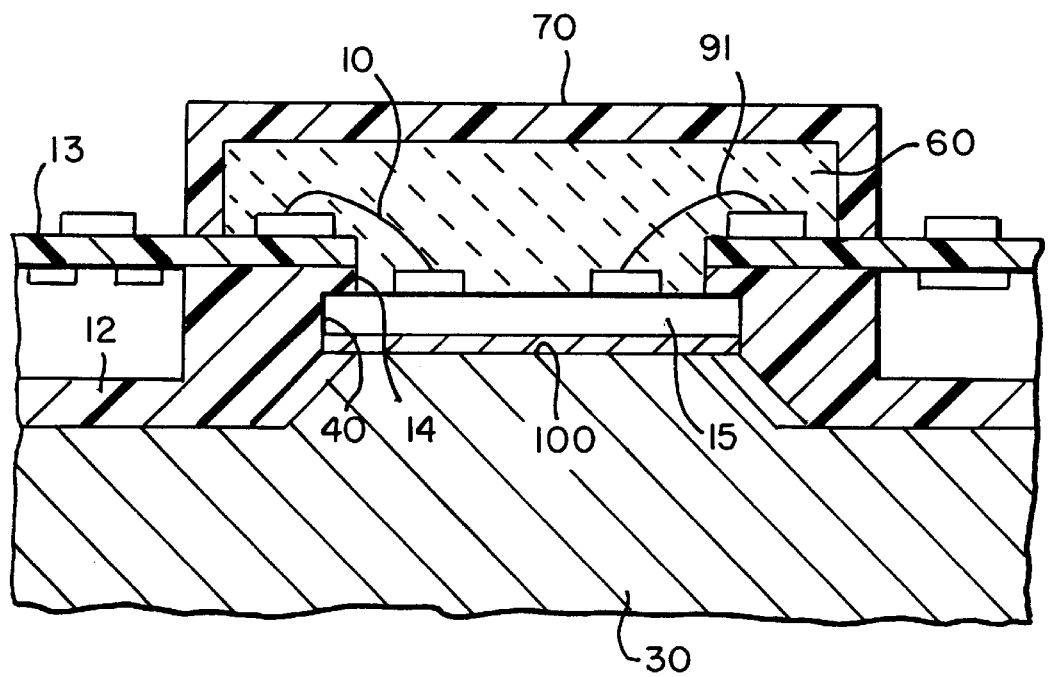
FIG. 4 is a cross section similar to that of FIGS. 2 and 3 showing the present invention.

In accordance with a first feature of the invention, and as shown in FIG. 4, the structure of insulation shell 12 is modified so that shoulder 14 is moved up much higher toward the plane of PCB 13. The bottom of IMS 15 is then moved substantially above the plane of the bottom of shell 12. A mesa 100 with a flat upper surface is then formed on heat sink 30 and is arranged to press against the bottom of IMS 15 which is confined in shoulder 40 which surrounds window 14.

The resulting structure brings the upper surface of the die 20 and 21 closer to the plane of PCB 13 (which may surround IMS 15, as shown in FIG. 4). Consequently, the volume above IMS 15 which must be filled with silastic 60 is considerably reduced; the length of wire bonds 90 and 91 is shortened, reducing mechanical stress on the wire bonds during operation; and the wire bondability and quality is improved, improving production yield.

Figure 5:
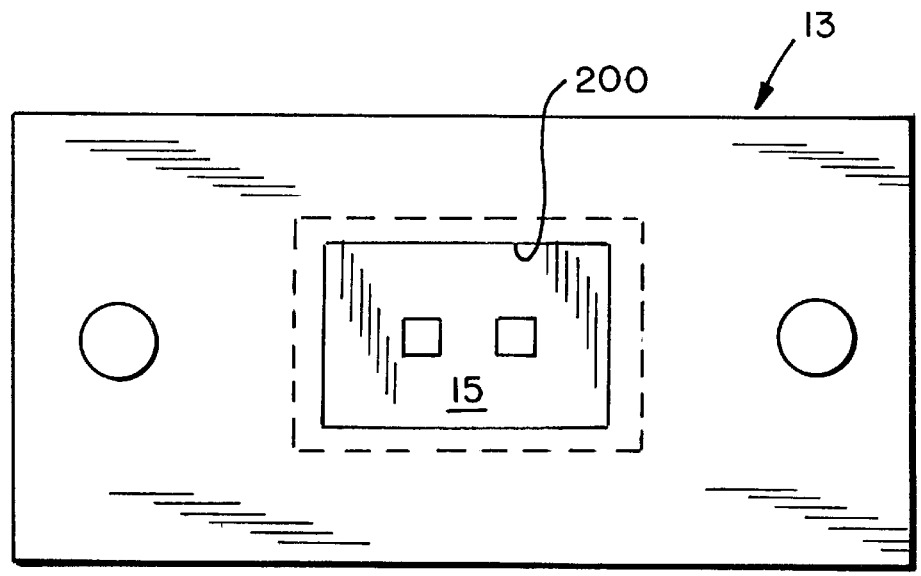
FIG. 5 shows the manner in which the PCB is modified in accordance with the present invention.
Figure 6:
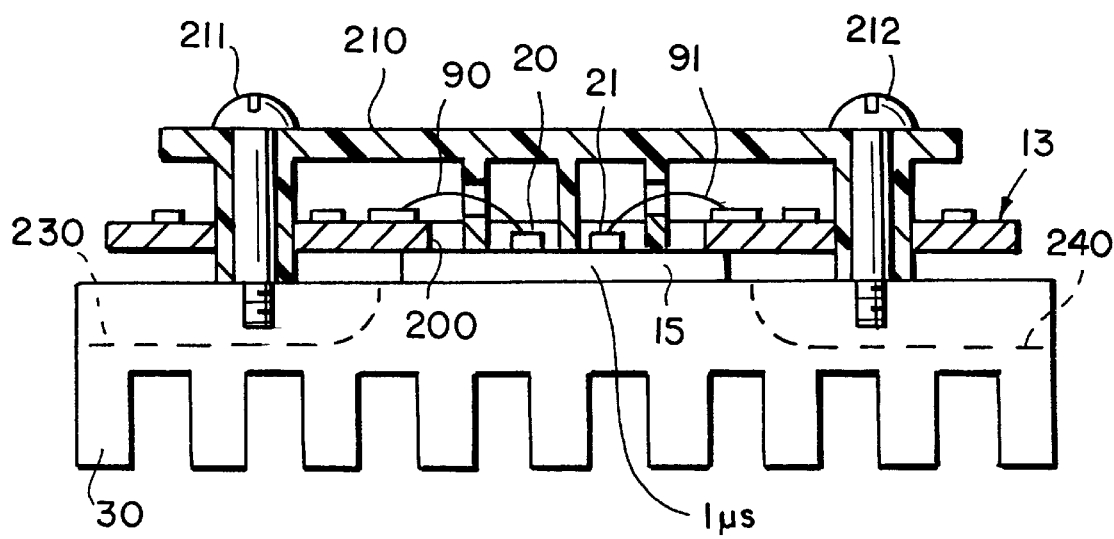
FIG. 6 is a cross sectional view of the assembly of the device similar to that of FIG. 2A, but in accordance with the invention, with the insulation shell removed.

FIGS. 5 and 6 show a second feature of the present invention and parts similar to these of FIGS. 1 to 4 carry the same identifying numeral. It will first be noted that PCB 13 is modified in FIG. 5 (the components thereon are not shown) to have an enlarged opening 200 therein. The IMS 15 is cemented, at its outer edge, to the underlying rim of opening 200. The die and substrate and PCB are then suitably wire bonded and the subassembly is electrically tested.

An insulation cap 210 is then mounted as shown, to enclose the upper surface of the IMS 15 and the wire bonds therein. Screws 211 and 212 which pass through the PCB 13 are threaded into heat sink 30 to fix the cap 210, PCB 13 and IMS 15 in place. The cap and the IMS may be secured to heat sink 30 by a suitable adhesive. The cap is then filled with a suitable potting compound through openings in the cap, not shown, and the compound is then cured.

The novel structure of FIGS. 5 and 6 eliminates the conventional insulation base shell 12 of FIGS. 1 to 4. Further, the thermal connection of IMS 15 and substrate 15 is improved and pretesting of the circuit is possible before capping.

Note that if components are desired on the underside of PCB 13 that the heat sink 30 can be undercut as shown by dotted lines 230, 240 in FIG. 6 to provide the necessary room around peripheral portions of the heat sink 30.

The foregoing description of the preferred embodiments of the present invention have been provided for the purposes of illustration and description. It is not intended to be exhaustive or to limit the invention to the precise forms disclosed. Many modifications and variations are possible in light of the above teaching. It is intended that the scope of the invention not be limited to this detailed description, but rather by the claims appended hereto.

What is claimed is:

1. A power semiconductor device module comprising a thin flat thermally conductive substrate having a bottom surface engageable by a heat sink surface and a top surface receiving at least one power semiconductor die in surface-to-surface contact; the top surface of said at least one semiconductor die having control electrode means; an enlarged planar printed circuit board having electrical components thereon for the control of said at least one power semiconductor die; said printed circuit board having an opening therein of a shape which at least approximates the shape of said thermally conductive substrate; said printed circuit board being disposed in a plane parallel to the plane of said substrate and being placed above said substrate; at least one wire bond connection extending from at least one of said components on said printed circuit board, through said opening in said printed circuit board and to said control electrode means on said semiconductor die; and an insulation shell for supporting said substrate; said insulation shell having an opening therethrough for exposing said bottom surface of said substrate around a peripheral edge thereof and for receiving a projecting mesa of a heat sink which engages said bottom surface of said substrate; the upper surface of said insulation shell receiving and supporting the bottom surface of said printed circuit board.

2. The module of claim 1, which further includes an insulation cap disposed atop and enclosing the area of said opening and defining a dielectric fluid filled volume atop said semiconductor die.

3. A power semiconductor device module comprising a thin flat thermally conductive substrate having a bottom surface engageable by a heat sink surface and a top surface receiving at least one power semiconductor die in surface-to-surface contact; the top surface of said at least one semiconductor die having control electrode means; an enlarged planar printed circuit board having electrical components thereon for the control of said at least one power semiconductor die; said printed circuit board having an opening therein of a shape which at least approximates the shape of said thermally conductive substrate; said printed circuit board being disposed in a plane parallel to the plane of said substrate and being displaced above said substrate; and at least one wire bond connection extending from at least one of said components on said printed circuit board, through said opening in said printed circuit board and to said control electrode means on said semiconductor die, wherein at least portions of the peripheral top surface of said substrate are fixed to corresponding peripheral portions of the bottom of said printed circuit board adjacent said opening in said printed circuit board.

4. The module of claim 3, wherein said peripheral surfaces of said substrate and printed circuit board are fixed together by an adhesive.

* * * * *